US 6,551,399 B1

(12) United States Patent
Sneh et al.

(10) Patent No.: US 6,551,399 B1
(45) Date of Patent: Apr. 22, 2003

(54) FULLY INTEGRATED PROCESS FOR MIM CAPACITORS USING ATOMIC LAYER DEPOSITION

(75) Inventors: Ofer Sneh, Mountain View, CA (US); Thomas E. Seidel, Sunnyvale, CA (US)

(73) Assignee: Genus Inc., Sunnyvale, CA (US)

( * ) Notice: Subject to any disclaimer, the term of this patent is extended or adjusted under 35 U.S.C. 154(b) by 0 days.

(21) Appl. No.: 09/480,804

(22) Filed: Jan. 10, 2000

(51) Int. Cl.⁷ .............................. C30B 25/04
(52) U.S. Cl. .................. 117/102; 117/89; 117/105; 117/106
(58) Field of Search ................. 117/102, 103, 117/106, 89

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,416,933 A | 11/1983 | Antson et al. | |
| 4,533,410 A | 8/1985 | Ogura et al. | |
| 4,533,820 A | 8/1985 | Shimizu et al. | |
| 4,689,247 A | 8/1987 | Doty et al. | |
| 4,828,224 A | 5/1989 | Crabb et al. | |
| 4,836,138 A | 6/1989 | Robinson et al. | |
| 4,846,102 A | 7/1989 | Ozias | |
| 4,907,862 A | 3/1990 | Suntola | |
| 4,913,929 A | 4/1990 | Moslehi et al. | |
| 4,975,252 A | 12/1990 | Nishizawa et al. | |
| 4,976,996 A | 12/1990 | Monkowski et al. | |
| 4,993,360 A | 2/1991 | Nakamura et al. | |

(List continued on next page.)

FOREIGN PATENT DOCUMENTS

| | | |
|---|---|---|
| EP | 0 442490 A1 | 8/1991 |
| EP | 0 442490 B1 | 8/1991 |
| EP | 0 442 490 B1 | 8/1991 |
| EP | 0 442 490 A1 | 8/1991 |
| EP | 0 511 264 B1 | 11/1992 |

(List continued on next page.)

OTHER PUBLICATIONS

Atomic Layer Epitaxy. T. Suntola and M. Simpson. Blackie and Son Ltd. 1990. pp. 1–39.

Atomic Layer Epitaxy. Collin H. L. Good man and Markus V. Pessa. J. Appl. Phys. 60(3), Aug. 1, 1986. The American Institute of Physics. pp. R65–R81.

Bedair, S. M. et al., "Atomic Layer Epitaxy of III–V Binary Compounds," Appl. Phys. Lett. (1985) 47(1):51–3.

Bedair, S. M. "Atomic Layer Epitaxy Deposition Processess," J. Vac. Sci. Technol. (1994) B12(1): 179–85.

Colas, E. et al., "Atomic Layer Epitaxy of Device Quality GaAs," Appl. Phys. Lett. (1989) 55(26): 2769–71.

Colter, P.C. et al., "Atomic Layer Epitaxy of Device Quality GaAs with a 0.6 pm/h Growth Rate," Appl. Phys. Lett. (1991) 59(12): 1440–42.

Dillon, A.C. et al., "Surface Chemistry of Al2O3 Deposition Using Al(CH3)3 and H2O in a Binary Reaction Sequence," Surf. Sci. (1995) 322(1–3): 230–42.

(List continued on next page.)

*Primary Examiner*—Robert Kunemund
(74) *Attorney, Agent, or Firm*—Blakely Sokoloff Taylor & Zafman LLP

(57) ABSTRACT

A method and apparatus for fabricating a metal-insulator-metal capacitor by performing atomic layer deposition (ALD). A fully integrated process flow prevents electrode-dielectric contamination during an essential ex situ bottom electrode patterning step.

12 Claims, 8 Drawing Sheets

U.S. PATENT DOCUMENTS

| | | | |
|---|---|---|---|
| 5,000,113 A | | 3/1991 | Wang et al. |
| 5,015,503 A | | 5/1991 | Varrin et al. |
| 5,071,733 A | * | 12/1991 | Uekita et al. ............... 430/326 |
| 5,072,262 A | * | 12/1991 | Uekita et al. ................. 357/6 |
| 5,077,875 A | | 1/1992 | Hoke et al. |
| 5,078,851 A | | 1/1992 | Nishihata et al. |
| 5,119,760 A | | 6/1992 | McMillan et al. |
| 5,156,820 A | | 10/1992 | Wong et al. |
| 5,194,401 A | | 3/1993 | Adams et al. |
| 5,204,314 A | | 4/1993 | Kirlin et al. |
| 5,270,247 A | | 12/1993 | Sakuma et al. |
| 5,281,274 A | | 1/1994 | Yoder |
| 5,294,778 A | | 3/1994 | Carman et al. |
| 5,320,680 A | | 6/1994 | Learn et al. |
| 5,336,327 A | | 8/1994 | Lee |
| 5,484,484 A | | 1/1996 | Yamaga et al. |
| 5,552,910 A | * | 9/1996 | Okano ......................... 359/60 |
| 5,582,866 A | | 12/1996 | White |
| 5,693,139 A | | 12/1997 | Nishizawa et al. |
| 5,711,811 A | | 1/1998 | Suntola et al. |
| 5,716,709 A | * | 2/1998 | Ferguson et al. ........... 428/420 |
| 5,749,974 A | | 5/1998 | Habuka et al. |
| 5,788,447 A | | 8/1998 | Yonemitsu et al. |
| 5,851,849 A | | 12/1998 | Comizzoli et al. |
| 5,879,459 A | | 3/1999 | Gadgil et al. |
| 5,916,365 A | | 6/1999 | Sherman |
| 5,935,338 A | | 8/1999 | Lei et al. |
| 6,007,330 A | | 12/1999 | Gauthier |
| 6,015,590 A | | 1/2000 | Suntola et al. |
| 6,042,652 A | | 3/2000 | Hyun et al. |
| 6,050,216 A | | 4/2000 | Szapucki et al. |
| 6,077,775 A | | 6/2000 | Stumborg et al. |
| 6,090,442 A | | 7/2000 | Klaus et al. |
| 6,124,158 A | | 9/2000 | Dautartas et al. |
| 6,139,700 A | | 10/2000 | Kang et al. |
| 6,143,659 A | | 11/2000 | Leem |
| 6,200,893 B1 | | 3/2001 | Sneh et al. |
| 6,270,572 B1 | | 8/2001 | Kim et al. |
| 6,305,314 B1 | | 10/2001 | Sneh et al. |

FOREIGN PATENT DOCUMENTS

| | | | |
|---|---|---|---|
| EP | 0 511 264 B1 | 8/1995 | |
| JP | 60-10625 | 1/1985 | |
| JP | 2-152251 | 6/1990 | ........... H01L/21/68 |
| JP | 5-152215 | 6/1993 | ......... H01L/21/205 |
| JP | 8-236459 | 9/1996 | ......... H01L/21/205 |
| JP | 10-102256 | 4/1998 | ........... H01L/16/44 |
| WO | WO 91/10510 | 7/1991 | |

OTHER PUBLICATIONS

Farrell, J.T. et al., "High Resolution Infrared Overtone spectroscopy of N2–HF: Vibrational Red Shifts and Predissociation Rate as a Function of HF Stretching Quanta," J. Phys. Chem. (1994) 98(24): 6068–74.

Fujiwara, H. et al., "Low Temperature Grown of ZnS,,Sel__, Alloys Fabricated by Hydrogen Radical Enhanced Chemical Vapor Deposition in an Atomic Layer Epitaxy Mode," J. Appl. Phys (1993) 74(9): 5510–5.

George, S. M. et al., "Atomic Layer Controlled Deposition of SiO2 and Al2O3 Using ABAB . . . Binary Reaction Sequence Chemistry," Appl. Surface Sci. (1994) 82/83: 460–7.

George, S.M. et al., "Surface Chemistry for Atomic Layer Growth," J. Phys. Chem.. (1996) 100(31): 13121–31.

Goodman, C. et al., "Atomic layer Epitaxy," J. Appl. Phys. (1986) 60(3): R65–R81.

Gotoh, J. et al., "Low–Temperature Growth of ZnSe–Based Pseudomorphic Structures by Hydrogen–Radical–Enhanced Chemical Vapor Deposition," J. Cryst. Growth (1992) 117: 85–90.

Higashi, G. et al., "Sequential Surface Chemical Reaction Limited Growth of High Quality Al2O3 Dielectrics," Appl. Phys. Lett. (1989) 55(19):1963–5.

Hukka, T. et al., "Novel Method for Chemical Vapor Deposition and Atomic Layer Epitaxy Using Radical Chemistry," Thin Solid Films (1993) 225: 212–18.

Imai, S. et al., "Atomic Layer Epitaxy of Si Using Atomic H," Thin Solid Films (1993) 225:168–72.

Imai, S. et al., "Hydrogen Atom Assisted ALE of Silicon," Appl. Surf. Sci. (1994) 82–83: 322–6.

Kattelus, H. et al., "Layered Tantalum–Aluminum Oxide Films Deposited by Atomic Layer Epitaxy," Thin Solid Films (1993) 225: 296–98.

Klaus, J.W. et al., "Atomic Layer Deposition of SiO2 Using Catalyzed and Uncatalyzed Self–Limiting Surface Reactions," Surf. Review and Letters (1999) 6(3–4): 435–48.

Klaus, J.W. et al., "Growth of SiO2 at Room Temperature with the Use of Catalyzed Sequential Half Reactions," Science (1997) 278(5345): 1934–6.

Kodama, K. et al., "In situ X–ray Photoelectron Spectroscopic Study of GaAs Grown by Atomic Layer Epitaxy," Appl. Phys. Lett. (1989) 54(7): 656–7.

Koleske, D. et al., "Atomic Layer Epitaxy of Si on Ge(100) Using Si2Cl6 and Atomic Hydrogen," Appl. Phys. Lett. (1994) 64(7): 884–6.

Koleske, D. et al., "Surface Morphology of Si on Si(100) Grown Below 500 Degrees C. Using H/Cl Exchange Chemistry," J. Appl. Phys. (1993) 74(6): 4245–7.

Lubben, D. et al., "UV Photostimulated Si Atomic–Layer Epitaxy," Mat. Res. Soc. Symp. Proc. (1991) 22: 177–187.

McDermott, B. et al., "Ordered GaInP by Atomic Layer Epitaxy," J. Cryst. Growth (1991) 107(1–4): 96–101.

Nishizawa, J. et al., "Molecular Layer Epitaxy of Silicon," J. Cryst. Growth (1990) 99: 502–5.

O'Hanlon, J. "Gas Release From Solids," A User's Guide to Vacuum Technology (1989) Chap. 4: 56–71.

Ott, A. W. et al., "Al2O3 Thin Film Growth on Si(100) Using Binary Reaction Sequence Chemistry," Thin Solid Films (1997) 292(1–2): 135–44.

Ott, A.W. et al., "Modification of Porous Alumina Membranes Using Al2O3 Atomic Layer Controlled Deposition," Chem. of Materials (1997) 9(3): 707–14.

Ott, A.W. et al., "$urface Chemistry of In2O3 Deposition Using In(CH3)3 and H2O in a Binary Reaction Sequence," Appl. Surf. Sci. (1997) 112:205–15.

Ozeki, M. et al., "Kinetic Processes in Atomic–Layer Epitaxy of GaAs and AlAs Using a Pulsed Vapor–Phase Method," J. Vac. Sci. Technol. (1987) B5(4): 1184–86.

Ritala, M. et al. "Growth of Titanium Dioxide Thin Films by Atomic Layer Epitaxy," Thin Solid Films (1993) 225: 288–95.

Ritala, M. et al., "Surface Roughness Reduction in Atomic Layer Epitaxy Growth of Titanium Dioxide Thin Films," Thin Solid Films (1994) 249: 155–62.

Roth, A. "The Vacuum," Vacuum Technology (1990) Chap. 1: 1–7 and Chap. 2: 28–45.

Sakaue, H. et al., "Digital Chemical Vapor Deposition of SiO2 Using a Repetitive Reaction of Triethysilane/Hydrogen and Oxidation," Jpn. J. of Appl. Phys. (1990) 30(113): L124–7.

Sneh, O. and George, S. "Diffusion of Xe on a Stepped It (11, 11,9)) Surface," Am. Chem. Soc. Abstracts of Papers (1993) Part 2 (235).

Sneh, O. and George, S. "Xenon Diffusion on a Stepped It (11, 11,9)) Surface," J. Chem. Phys.(1994) 101(4): 3287–97.

Sneh, O. et al., "Adsorption and Desorption Kinetics of H2O on a Fully Hydroxylated SiO2 Surface," Surface Science (1996) 364: 61–78.

Sneh, O. et al., "Atomic Layer Growth of SiO2 on Si(100) Using SiCl4 and H2O in a Binary Reaction Sequence," Surf. Sci.. (1995) 334: 135–52.

Sneh, O. et al., "Atomic Layer Growth of SiO2 on Si(100) Using the Sequential Deposition of SiCl4 and H2O," Mat. Res. Soc. Symp. Proc., (1994) 334: 25–30.

Sneh, O. et al., "Atomic Layering Shows Its Metal," European Semiconductor (2000).

Sneh, O. et al., "Sample Manipulator Employing a Gas–Thermal Switch Designed for High Pressure Experiments in an Ultrahigh Vacuum Apparatus," J. Vac. Sci. Technol. (1995) A13(2): 493–6.

Sneh, O. et al., "Thermal Stability of Hydroxyl Groups on a Well–Defined Silica Surface," J. Phys. Chem.. (1995) 99(13): 4639–47.

Somorjai, G. "An Introduction to Surface Chemistry and Catalyst," Surface (1994) Chap. 1: 12–7.

Sugahara, S. et al., "Atomic Layer Epitaxy of Germanium," Appl. Surf. Sci. (1994) 82–83: 380–6.

Suntola, T. "Atomic Layer Epitaxy," Handbook of Crystal Growth 3 (1994) Chap. 14: 605–63.

Suntola, T. "Atomic Layer Epitaxy," Materials Science Reports (1989) 4: 261–312.

Suntola, T. "Atomic Layer Epitaxy," Thin Solid Films (1992) 216: 84–9.

Suntola, T. "Cost Effective Processing by Atomic Layer Epitaxy," Thin Solid Films (1993) 225: 96–8.

Suntola, T. "Surface Chemistry of Materials Deposition at Atomic Layer Level," Appl. Surf Sci. (1996)'100/101: 391.8.

Suntola, T. et al., "Atomic Layer Epitaxy," Blackie & Son Ltd. (1990): 1–39.

Tischler, M.A. et al., "Growth and Characterization of Compound Semiconductors by Atomic layer Epitaxy," J. Cryst. Growth (1986) 77: 89–94.

Watanabe, A. et al., "The Mechanism of Self–Limiting Growth of Atomic Layer Epitaxy of GaAs by Metalorganic Molecular Bean Epitaxy Using Trimethylgallium and Arsine," Jpn. J. Of Appl. Phys. (1989) 28(7): L 1080–82.

Wise, M.L. et al., "Adsorption and Decomposition of Diethyldiethoxysilane on Silicon Surfaces: New Possibilities for SiO2 Deposition," J. Vac. Sci. Technol. (1995) B 13(3): 865–75.

Wise, M.L. et al., "H2O Adsorption Kinetics on Si(111) 7×7 and Si(111) 70 Modified by Laser Annealing," J. Vac. Sci. Technol. (1995) Al 3(4): 1853–60.

Wise, M.L. et al., "Diethyldiethoxysiliane as a New Precursor for SiO2 Growth on Silicon," Mat. Res. Soc. Symp. Proc., (1994) 334: 37–43.

Wise, M.L. et al., "Reaction Kinetics of H2O with Chlorinated Si(I 11)–7×7 and Porous Silicon Surfaces," Surf. Sci.(1996) 364(3):367–79.

Yamaga, S. and Yoshikawa, A. "Atomic Layer Epitaxy of ZnS by a New Gas Supplying System in Low–Pressure Metalorganic Vapor Phase Epitaxy," J. Cryst. Growth (1992) 117: 152–155.

Yarnoff, J. et al., "Atomic Layer Epitaxy of Silicon by Dichlorosilane Studied with Core Level Spectroscopy," J. Vac. Sci. Technol. (1992) A10(4): 2303–7.

Yokoyama, H. et al., "Atomic Layer Epitaxy of GaAs Using Nitrogen Carrier Gas," Appl. Phys. Lett. (1991) 59(17): 2148–49.

Bedair, S.M. et al., "Atomic Layer Epitaxy of III–V Binary Compounds", Appl. Phys. Lett. (1985) 47(1): 51–3.

Tischler, M.A. et al., "Growth and Characterization of Compound Semiconductors by Atomic Layer Epitaxy", J. Cryst. Growth (1986) 77: 89–94.

Goodman, C. et al., "Atomic Layer Epitaxy", J. Appl. Phys. (1986) 60(3): R65–R81.

Ozeki, M. et al., "Kinetic Processes In Atomic–Layer Epitaxy of GaAs and Al As Using A Pulsed Vapor–Phase Method", J. Vac. Sci. Technol. (1987) B5(4): 1184–86.

O'Hanlon, J. "Gas Release From Solids", A Users Guide to Vacuum Technology (1989) Chap. 4: 56–71.

Watanabe, A. et al., "The Mechanism of Self–Limiting Growth of Atomic Layer Epitaxy of GaAs By Metalorganic Molecular Bean Epitaxy Using Trimethylgallium and Arsine", Jpn.J. of Appl. Phys. (1989) 28(7): L 1080–82.

Suntola, T. "Atomic Layer Epitaxy", Material Science Reports (1989) 4: 261–312.

Kodama, K. et al, "In Situ X–Ray Photoelectron Spectroscopic Study of GaAs Grown By Atomic Layer Epitaxy", Appl. Phys. Lett. (1989) 54(7): 656–7.

Higashi, G. et al., "Sequential Surface Chemical Reaction Limited Growth of High Quality A12O3 Dielectrics", Appl. Phys. Lett. (1989) 55(19): 1963–5.

Colas, E. et al., "Atomic Layer Epitaxy of Device Quality GaAs", Appl. Phys. Lett. (1989) 55(26): 2769–71.

Suntola, T. et al., "Atomic Layer Epitaxy", Blackie & Son Ltd. (1990): 1–39.

Nishizawa, J. et al., "Digital Chemical Vapor Deposition of SiO2 Using A Repetitive Reaction of Triethysilane/ Hydrogen and Oxidation", Jpn. J. of Appl. Phys. (1990) 30(1B): L124–7.

Sakaue, H. et al., "Digital Chemical Vapor Deposition of SiO2 Using A Repetitive Reaction of Triethysilane/ Hydrogen and Oxidation", Jpn. J. of Appl. Phys. (1990) 30(1B): L124–7.

Roth, A. "The Vacuum", Vacuum Technology (1990) Chap. 1: 1–7 and Chap. 2: 28–45.

McDermott, B. et al., "Ordered GaInP by Atomic–Layer Epitaxy", J. Cryst. Growth (1991) 107(1–4): 96–101.

Lubben, D. et al., "UV Photostimulated Si Atomic–Layer Epitaxy", Mat. Res. Soc. Symp. Proc. (1991) 222: 177–187.

Colter, P.C. et al., "Atomic Layer Epitaxy of Device Quality GaAs with a 0.6 μm/h Growth Rate", Appl. Phys. Lett. (1991) 59(12): 1440–42.

Yokoyama, H. et al., "Atomic Layer Epitaxy of GaAs Using Nitrogen Carrier Gas", Appl. Phys. Lett. (1991) 59(17): 2148–49.

Yamaga, S. and Yoshikawa, A. "Atomic Layer Epitaxy of ZnS by a New Gas Supplying System in Low–Pressure Metalorganic Vapor Phase Epitaxy", J. Cryst. Growth (1992) 117: 152–155.

Gotoh, J. et al., "Low–Temperature Growth of ZnSe–Based Pseudomorphic Structures By Hydrogen–Radical–Enhanced Chemical Vapor Deposition", J. Cryst. Growth (1992) 117: 85–90.

Suntola, T. "Atomic Layer Epitaxy", Thin Solid Films (1992) 216: 84–9.

Yarnoff, J. et al., "Atomic Layer Epitaxy of Silicon By Dichlorosilane Studied with Core Level Spectroscopy", J. Vac. Sci. Technol. (1992) A10(4): 2307–7.

Suntola, T. "Cost Effective Processing by Atomic Layer Epitaxy", Thin Solid Films (1993) 225: 96–8.

Imai, S. et al., "Atomic Layer Epitaxy of Si Using Atomic H", Thin Solid Films (1993) 225: 168–72.

Hukka, T. et al., "Novel Method For Chemical Vapor Deposition and Atomic Layer Epitaxy Using Radical Chemistry", Thin Solid Films (1993) 225: 212–18.

Ritala, M. et al., "Growth of Titanium Dioxide Thin Films By Atomic Layer Epitaxy", Thin Solid Films, (1993) 225: 288–95.

Kattelus, H. et al., "Layered Tantalum–Aluminum Oxide Films Deposited By Atomic Layer Epitaxy", Thin Solid Films (1993) 225: 296–98.

Sneh, O. and George, S., "Diffusion of Xe on a Stepped It (11, 11, 9) surface", Am. Chem. Soc. Abstracts of Papers (1993) Part 2 (235).

Koleske, D. et al., "Surface Morphology of Si on Si (100) Grown Below 500 Degrees C. Using H/C1 Exchange Chemistry", J. Appl. Phys. (1993) 74(6): 4245–7.

Fujiwara, H. et al., "Low Temperature Grown of ZnSxSe1–x Alloys Fabricated by Hydrogen Radical Enhanced Chemical Vapor Deposition in an Atomic Layer Epitaxy Mode", J. Appl. Phys. (1993) 74(9): 5510–5.

Somorjai, G. "An introduction to surface Chemistry and Catalysis" (1994) Chap. 1: 12–7.

George S.M. et al., "Atomic Layer Controlled Deposition of SiO2 and Al2O3 Using ABAB . . . Binary Reaction Sequence Chemistry", Appl. Surface Sci. (1994) 82/83: 460–7.

Suntola, T. "Atomic Layer Epitaxy", Handbook of Crystal Growth 3 (1994) Chap. 14: 605–63.

Bedair, S.M. "Atomic Layer Epitaxy Deposition Processes" J. Vac. Sci. Technol. (1994) B12(1) 179–85.

Sneh, O. et al., "Atomic Layer Growth of SiO2 on Si (100) Using the Sequential Deposition of SiC14 and H2O," Mat. Res. Soc. Symp. Proc. (1994) 334: 25–30.

Wise, M.L. et al., "Diethyldiethoxysilane as a New Precursor for SiO2 Growth on Silicon", Mat. Res. Soc. Symp. Proc. (1994) 334: 37–43.

Ritala, M. et al., "Surface Roughness Reduction in Atomic Layer Epitaxy Growth of Titanium Dioxide Thin Films", Thin Solid Films (1994) 249: 155–62.

Koleske, D. et al., "Atomic Layer Epitaxy on Si on Ge(100) Using Si2C16 and Atomic Hydrogen", Appl. Phys. Lett. (1994) 64(7): 884–6.

Farrell, J.T. et al., "High Resolution Infrared Overtone Specroscopy of N2–HF: Vibrational Red Shifts and Predissociation Rate as a Function of HF Stretching Quanta", J. Phys. Chem. (1994) 98(24): 6068–74.

Sneh, O. and George, S. "Xenon diffusion on Stepped It (11,11,9) Surface", J. Chem. Phys. (1994) 101(4): 3287–97.

Imai, S. et al., "Hydrogen Atom Assisted ALE of Silicon", Appl. Surf. Sci. (1994) 82–83: 322–6.

Sugahara, S. et al., "Atomic Layer Epitaxy of Germanium" Appl. Surf. Sci. (1994) 82–83: 380–6.

Dillon, A.C. et al., "Surface Chemistry of Al2O3 Deposition Using Al(CH3)3 and H2O in a Binary Raction Sequence", Surf. Sci. (1995) 322(1–3): 230–42.

Sneh, O. et al., "Atomic Layer Growth of SiO2 on Si(100) Using SiC14 and H2O in Binary Reaction Sequence" Surf. Sci. (1995) 334: 135–52.

Sneh, O. et al., "Sample Manipulator Employing A Gas–Thermal Switch Designed For High Pressure Experiments in an Ultrahigh Vacuum Apparatus" J. Vac. Sci. Technol. (1995) A13(2): 493–6.

Sneh, O. et al., "Thermal Stability of Hydroxyl Group1 on a Well Defined Silica Surface", J. Phys. Chem. (1995) 99(13): 4639–47.

Wise, M. L. et al., "Adsorption and Decomposition of Diethyldiethoxysilane on Silicon Surfaces: New Possibilities for SiO2 Deposition", J. Sci. Technol. (1995) B13(3): 865–75.

Wise, M.L. et al., "H2O Adsorption Kinetics on Si(111) 7×7 and Si(111) 7×7 Modified by Laser Annealing", J. Vac. Sci. Technol. (1995) A13(4): 1853–60.

Suntola, T. "Surface Chemistry of Materials Deposition at Atomic Layer Level", Appl. Surf. Sci. (1996) 100/101: 391–8.

Sneh, O. et al., "Adsorption and Desorption Kinetics of H2O on a Fully Hydroxylated SiO2 Surface", Surface Science, (1996) 364: 61–78.

Gorge, S.M. et al., "Surface Chemistry For Atomic Layer Growth", J. Phys. Chem. (1996) 100(31): 13121–31.

Wise, M.L. et al., "Reaction Kinetics of H2O with Chlorinated Si(111)–7×7 and Porous Silicon Surfaces", Surf. Sci. (1996) 364(3): 367–79.

Ott, A.W. et al., "Surface Chemistry of In2O3 Deposition Using In(CH3)3 and H2O in a Binary Reaction Sequence", Appl. Surf. Sci. (1997) 112:205–15.

Ott, A.W. et al., "Al3O3 Thin Film Growth on Si(100) Using Binary Reaction Sequence Chemistry", Thin Solid Films (1997) 292(1–2): 135–144.

Ott, A. W. et al., "Modification of Porous Alumina Membranes Using Al3O3 Atomic Layer Controlled Deposition", Chem. Of Materials (1997) 9(3): 707–14.

Klaus, J.W. et al., "Growth of SiO2 at Room Temperture With the Use of Catalyzed Sequential Half Reactions", Science (1997) 278(5345): 1934–6.

Klaus, J.W. et al., "Atomic Layer Deposition of SiO2 Using Catalyzed and Uncatalyzed Self–Limiting Surface Reaction", Surf. Review and Letters (1999) 6(3–4): 435–48.

Sneh, O. et al., "Atomic Layering Shows Its Metal", European Semiconductor (2000) 22(7): 33–6.

* cited by examiner

FULLY INTEGRATED PROCESS FOR MIM CAPACITORS USING ATOMIC LAYER DEPOSITION

The United States Government has rights in this invention pursuant to Contract No. F33615-99-C-2961 between Genus, Inc. and the U.S. Air Force Research Laboratory.

BACKGROUND OF THE INVENTION

1. Field of the Invention

The present invention relates generally to semiconductor technology and, more particularly, to a method and apparatus for manufacturing metal-insulator-metal capacitors using atomic layer deposition.

2. Background of the Related Art

In the manufacture of integrated circuits, many methods are known for depositing and forming various layers on a substrate. Chemical vapor deposition (CVD) and its variant processes are utilized to deposit thin films of uniform and, often times conformal coatings over high-aspect and uneven features present on a wafer. However, as device geometries shrink and component densities increase on a wafer, new processes are needed to deposit ultrathin film layers on a wafer. The standard CVD techniques have difficulty meeting the uniformity and conformity requirements for much thinner films.

One variant of CVD to deposit thinner layers is a process known as atomic layer deposition (ALD). ALD has its roots originally in atomic layer epitaxy, which is described in U.S. Pat. Nos. 4,058,430 and 4,413,022 and in an article titled "Atomic Layer Epitaxy" by Goodman et al., J. Appl. Phys. 60(3), Aug. 1, 1986; pp. R65–R80. Generally, ALD is a process wherein conventional CVD processes are divided into single-monolayer depositions, wherein each separate deposition step theoretically reaches saturation at a single molecular or atomic monolayer thickness and, then, self-terminates.

The deposition is an outcome of chemical reactions between reactive molecular precursors and the substrate (either the base substrate or layers formed on the base substrate). The elements comprising the film are delivered as molecular precursors. The desired net reaction is to deposit a pure film and eliminate "extra" atoms (molecules) that comprise the molecular precursors (ligands). In a standard CVD process, the precursors are fed simultaneously into the reactor. In an ALD process, the precursors are introduced into the reactor separately, typically by alternating the flow, so that only one precursor at a time is introduced into the reactor. For example, the first precursor could be a metal precursor containing a metal element M, which is bonded to an atomic or molecular ligand L to form a volatile molecule $ML_x$. The metal precursor reacts with the substrate to deposit a monolayer of the metal M with its passivating ligand. The chamber is purged and, then, followed by an introduction of a second precursor. The second precursor is introduced to restore the surface reactivity towards the metal precursor for depositing the next layer of metal. Thus, ALD allows for single layer growth per cycle, so that much tighter thickness controls can be exercised over standard CVD process. The tighter controls allow for ultrathin films to be grown.

CVD is a typical process for use in forming metal-insulator-metal (MIM) capacitors. MIM capacitors are implemented by a sequence that includes bottom metal deposition, patterning, dielectric deposition, top metal deposition and patterning. MIM capacitors are utilized in a variety of devices, including memory devices (such as dynamic random-access-memory, or DRAM). The general use of MIM capacitors in integrated circuits and RF circuits is known in the art.

Although currently manufactured MIM capacitors use CVD technology, none are known to have been fabricated by ALD. Since ALD has the ability to deposit continuous ultrathin films of conductive, semiconductive or insulating (dielectric) material on complicated geometries, yet retain good uniformity and conformity, ALD is attractive for fabricating MIM capacitors. The present invention is directed to providing the integration of ALD for the manufacture of MIM capacitors.

SUMMARY OF THE INVENTION

A method and apparatus for depositing a first conductive layer by atomic layer deposition and depositing a sacrificial layer above the first conductive layer also by atomic layer deposition without exposing the first conductive layer to oxidation. A defined structure is then formed by removing portions of the first conductive and sacrificial layers. Next, the sacrificial layer is removed to expose the underlying first conductive layer without exposing the first conductive layer to oxidation. A dielectric layer is next deposited over the exposed first conductive layer by atomic layer deposition. To form a metal-insulator-metal (MIM) capacitor, the stack is completed by depositing a top conductive layer.

DETAILED DESCRIPTION OF THE INVENTION

Figure 1:
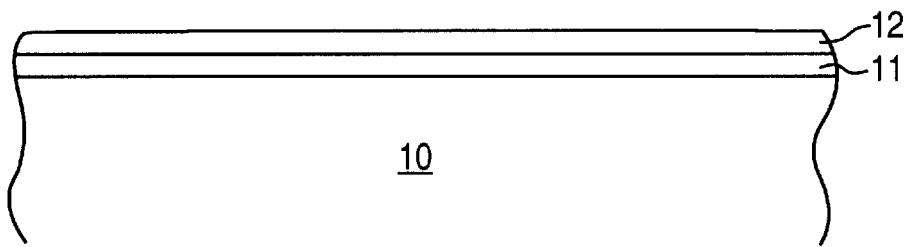
FIG. 1 is a cross-sectional diagram showing an embodiment of the present invention in forming a bottom conductive layer of a metal-insulator-metal (MIM) capacitor above a substrate in which an overlying sacrificial layer is also deposited to cover the bottom conductive layer.

The practice of atomic layer deposition (ALD) to deposit a film layer onto a substrate, such as a semiconductor wafer, requires separately introducing molecular precursors into a processing reactor. The ALD technique will deposit an ultrathin film layer atop the substrate. The term substrate is used herein to indicate either a base substrate or a material layer formed on a base substrate, such as a silicon substrate. The growth of the ALD layer follows the chemistries associated with chemical vapor deposition (CVD), but the precursors are introduced separately.

In an example ALD process for practicing the present invention, the first precursor introduced is a metal precursor comprising a metal element M bonded to atomic or molecular ligand L to make a volatile molecule $ML_x$ (the x, y and z subscripts are utilized herein to denote integers 1, 2, 3, etc.). It is desirable that the $ML_x$ molecule bond with a ligand attached to the surface of the substrate. An example ligand is a hydrogen-containing ligand, such as AH, where A is a nonmetal element bonded to hydrogen. Thus, the desired reaction is noted as $AH+ML_x \rightarrow AML_y+HL_z$ where HL is the exchange reaction by-product.

After the $ML_x$ precursor reacts with the surface and self-saturates to terminate the reaction, the remaining non-reacted precursor is removed, typically by allowing the carrier gas to purge the processing chamber. The second precursor is then introduced. Since the surface of the substrate contains the MA—L combination, the second precursor reacts with the L termination on the surface. In this example, the second precursor is comprised of $AH_z$, with A being a nonmetal element. The hydrogen component is typically represented by $H_2O$, $NH_3$ or $H_2S$. The reaction $ML+AH_z \rightarrow MAH+HL$ results in the desired additional element A being deposited as AH terminated sites and the ligand L is eliminated as a volatile by-product HL. The surface now has AH terminated sites, which restore the surface to have AH terminations. This restoration completes one ALD cycle, in which a monolayer of MA is deposited on the surface.

The present invention uses the ALD process to fabricate a metal-insulator-metal (MIM) capacitor on a semiconductor wafer, such as a silicon wafer. It is appreciated that one problem with a prior art technique (such as the generic CVD process) of forming capacitors on a wafer is in the oxidation of the bottom conductive layer of the capacitor. After deposition of the bottom conductive layer, pattern delineation (photolithographic patterning, etching, etc.) and/or cleaning steps can oxidize the surface of the bottom conductive layer (including, metal, metal nitride or semiconducting layer).

The extent of oxidation varies with the substrate and the cleaning process, but typically accounts for more than 10 Angstroms. The air exposure of the bottom conductor during pattern delineation, as well as some oxygen plasma ashing processes that are conventionally applied to remove photoresist, will oxidize the surface of the bottom electrode, which will interface with an overlying insulator material. Parasitic oxide in the metal-dielectric interface is undesirable, since these low quality oxides do not contribute to the insulating properties of the MIM capacitor. Worse, the added thickness may reduce the capacitance value by making the effective dielectric thicker. In addition, these poorly defined oxides may interfere with surface activation of the following dielectric ALD film and deteriorate the insulating properties of the ALD dielectric film. Furthermore, where ultrathin film layers (of 50 Angstroms or less) are being grown by ALD, oxidized regions of 10 Angstroms have considerable more impact than film layers (of much higher thickness) grown by conventional CVD techniques. The present invention is practiced to remove or inhibit these deficiencies.

Referring to FIGS. 1–4, one embodiment for practicing the present invention is shown. In FIG. 1, a substrate 10 (again, substrate is used herein to refer to either a base substrate or a material film layer formed on a base substrate) is shown upon which ALD is performed. A first conductive layer, which is typically a metal (M1) layer, 11 is deposited by ALD. Typically, M1 layer 11 is comprised of a metal or metal nitride, including Ta, $Ta_xN$, Ti, TiN or Al, which is used for constructing MIM capacitors. A typical example structure for a MIM is $Ta_xN/Al_2O_3/Ta_xN$ stack on HSG (high surface area polysilicon grain) layer. Thus, substrate 10 can be HSG, while M1 layer 11 can be $Ta_xN$. With ALD, M1 layer 11 is deposited to an approximate thickness, of 30–50 angstroms.

Subsequently, a sacrificial layer 12 is deposited overlying layer 11 by ALD. The sacrificial layer 12 is deposited by ALD, without oxidizing the surface of the M1 layer 11. Accordingly, layer 12 is deposited in the same processing chamber or in another chamber of the same cluster tool, so that M1 layer 11 is not exposed to an oxidizing or contaminating environment. Generally, the sacrificial layer 12 is also comprised of metal material. The composition of the sacrificial layer should be such that a given in situ dry etch chemistry will remove the sacrificial layer 12, but not the underlying M1 layer 11. The thickness of the sacrificial layer deposited by ALD will depend on other properties, but typically a thin layer in the approximate range of 20–50 Angstroms is deposited.

For example, if the composition of M1 layer 11 is such that it does not etch in fluorine-based plasma (such as Ta, $Ta_xN$, Ti, TiN or Al), then the sacrificial layer 12 can be comprised of material which etches in fluorine-based plasma. Accordingly, with the M1 layer 11 being comprised of the material noted above, the sacrificial layer 12 can be comprised of W, $WS_x$, $W_xN$ or $SiO_2$, just to name a few examples. These materials will be etched by fluorine atoms.

Again it is to be noted that the sacrificial layer 12 is deposited immediately after the deposition of the M1 layer, without air exposure of the M1 layer and without significant delay. The sacrificial layer 12 provides a covering layer over the M1 layer 11. Subsequently, the wafer is removed from the processing chamber (or cluster tool) for pattern delineation. The wafer can now be exposed to air (ambient) or other oxygen and/or contaminating environment since the M1 layer 11 is not exposed. Since some appreciable time is required for pattern delineation, oxidation will most likely occur on the top layers of the sacrificial layer 12, but this is permitted, since the sacrificial layer will be later removed.

Figure 2:
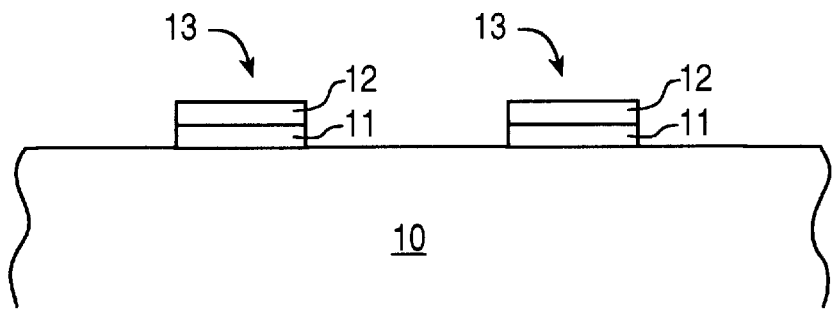
FIG. 2 is a cross-sectional diagram showing the patterning and etching of the structure of FIG. 1 to define the MIM capacitor stack.

FIG. 2 shows the substrate 10 having a pattern delineated stack 13 formed thereon. A variety of photolithographic and etching techniques can be used to form the patterned stack 13. Typically, anisotropic etch is used. Then, the wafer is placed back in the same or different processing chamber and subjected to an etch process. In the case of the above example, fluorine-based chemistry, such as $NF_3$, is used to etch away the W-based sacrificial layer 12, while not etching the M1 layer 11. This etching process exposes the underlying M1 layer 11 of stack 13. The materials for the two layers 11, 12 and the etch chemistry should be chosen, so that the etch chemistry is selective to remove the sacrificial layer 12 and not the M1 layer 11.

Figure 3:
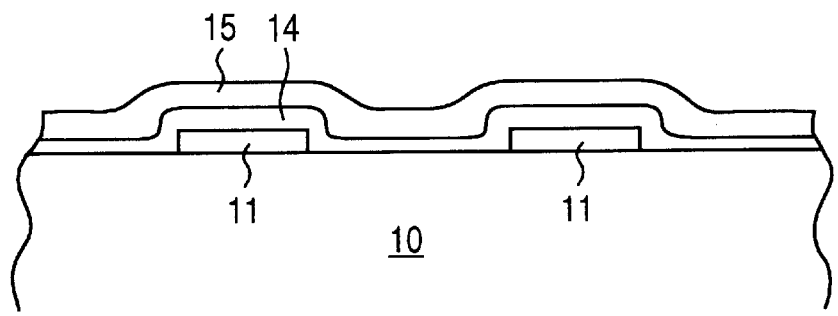
FIG. 3 is a cross-sectional diagram showing a removal of the sacrificial layer of FIG. 2 and subsequent deposition of a dielectric layer and a top conductive layer of the MIM capacitor.

Then, as shown in FIG. 3, a dielectric layer 14 is deposited by ALD. The ALD deposits a uniform and conformal layer 14 over the substrate 10, as well as stack 13. In the example, the dielectric layer 14 is comprised of $Al_2O_3$. Typically, $Al_2O_3$ is deposited to a thickness in the approximate range of 15–50 Angstroms by ALD. It is to be noted that in the preferred technique, the dielectric layer 14 is deposited without subjecting the exposed M1 layer to oxidation and/or contamination. That is, when the sacrificial layer is removed (etched) in a processing chamber, the wafer is processed, in the same chamber or in another chamber of the same cluster tool without being exposed to air or contamination, to deposit the dielectric layer 14.

Next, a top conductive layer, typically a metal (M2) layer, 15 is deposited overlying the dielectric layer 14, having a thickness as practically needed in the approximate range of 30–3000 Angstroms. The M2 layer can be deposited by ALD, CVD, plasma-enhanced CVD (PECVD) or another process. In the preferred technique, ALD is still preferred over other processes for improved controls on the deposition of the M2 layer 15. For a thicker top electrode, a combination of ALD and CVD could be used.

Figure 4:
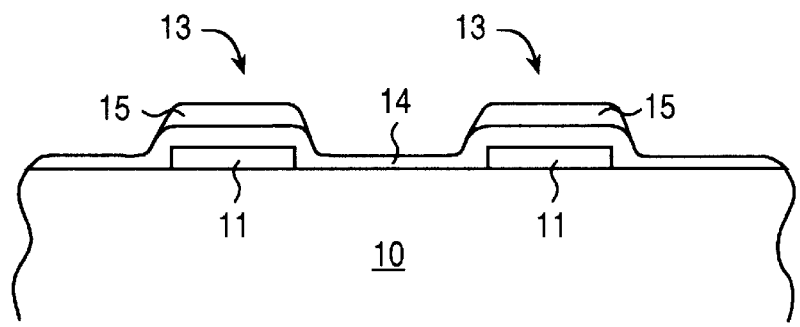
FIG. 4 is a cross-sectional diagram showing the final formation of the MIM capacitor stack from the structure of FIG. 3.

As shown in FIG. 4, the wafer is patterned and etched to form the completed MIM stack 13. Typically, anisotropic etch is used. The final MIM capacitor stack 13 is comprised of the M1 layer 11, dielectric layer 14 and M2 layer 15 overlying the substrate 10. Two such stacks 13 are shown in FIG. 4. ALD is used to deposit layers 11 and 14, as well as the sacrificial layer 12 (which has been consumed). ALD can be used to deposit M2 layer as well.

Although the embodiment described above provides an effective ALD deposited MIM capacitor, improvements to the process can enhance the properties of the MIM capacitor. Instead of applying the $ML_x$ precursor initially onto the substrate 10, one or more radical specie(s), including such species as oxygen, hydrogen, OH, $NH_2$, Cl and F, can be introduced to react with the surface of the substrate. The particular species selected will depend on the surface chemistry. Thus, a given species is utilized to modify the surface of the substrate. Essentially, the reactive species pretreats the surface so that the surface is more susceptible to reacting with the precursor. The reactive species typically will modify the surface by exchanging other surface species and/or attaching to previously reconstructed sites to provide more termination sites for the precursor being utilized. For example, $SiO_2$ surface with approximately 100% siloxane SiOSi bridge is generally inert. OH, H or O radical exposure can efficiently insert HOH into the SiOSi to generate 2 Si—OH surface species that are highly reactive with $ML_x$ molecular precursor.

Figure 5:
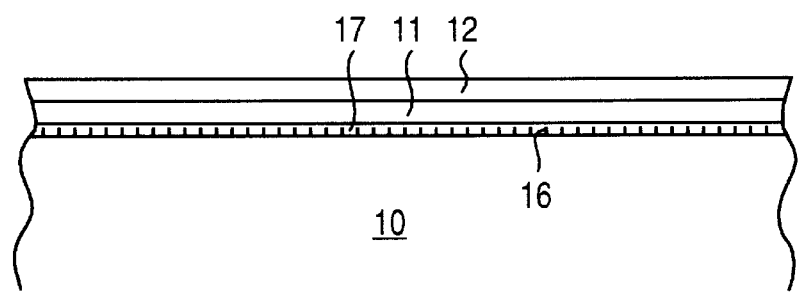
FIG. 5 is a cross-sectional diagram showing another embodiment of the present invention in pretreating a substrate to make it more reactive, forming an adhesion layer above the substrate, forming a bottom conductive layer of a metal-insulator-metal (MIM) capacitor and forming an overlying sacrificial layer to cover the bottom conductive layer.

Referring to FIGS. 5–11, an alternative embodiment of the invention is shown. In FIG. 5, the surface of the substrate 10 is pretreated prior to the deposition of the M1 layer 11. Pretreating the surface of the substrate 10 results in a more reactive surface, which is shown by the formation of ample termination sites 16 on the surface of the substrate 10. With the $AH+ML_x \rightarrow AML_y+HL$ reaction described above, in which $ML_x$ is the first precursor for depositing the M1 layer, it is desirable to have ample AH termination sites on the surface of the substrate 10. The surface is pretreated to have additional AH termination sites 16 present.

Thus, in addition to the earlier example provided above (FIGS. 1–4), an alternative technique is to pretreat the various surfaces to make the surface reactive prior to performing ALD. In FIG. 5, the surface pretreatment creates additional termination sites 16. Where $Ta_xN/Al_2O_3/Ta_xN$ MIM capacitor is being fabricated on HSG, $NH_3/H_2$ plasma is used to activate the surface of the substrate 10. Although the M1 layer 11 could be deposited on the treated surface, several monolayers of Ta film are deposited by ALD to form an adhesion layer 17 to promote good adhesion of the M1 metal onto the substrate.

Figure 6:
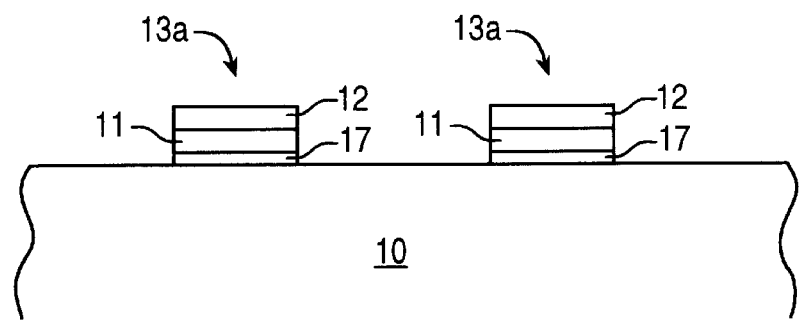
FIG. 6 is a cross-sectional diagram showing the patterning and etching of the structure of FIG. 5 to define the MIM capacitor bottom electrode.

It is appreciated that the composition of the adhesion film 17 is dependent on the chemistries of the materials being utilized. In this example Ta is deposited on HSG, which has its surface activated for Ta. Subsequently, TaN is deposited by ALD to form the $Ta_xN$ (M1) layer 11 to a thickness in the range of 30–50 angstroms. This is then followed by the deposition of the sacrificial layer 12 (to a thickness of about 20–50 angstroms), without exposing the M1 layer to an oxidant or contamination. Subsequently, the wafer is unloaded and then subjected to the pattern delineation steps described above. The resulting MIM stack 13a is shown in FIG. 6.

Figure 7:
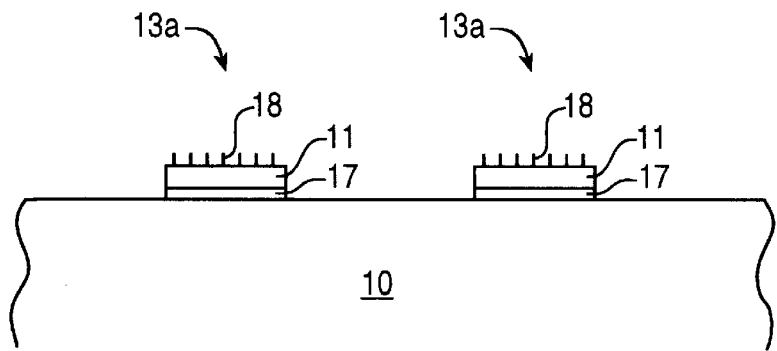
FIG. 7 is a cross-sectional diagram showing a removal of the sacrificial layer of FIG. 6 and subsequent pretreatment of the exposed surface to pretreat the surface of the bottom conductive layer for deposition of a dielectric layer.
Figure 8:
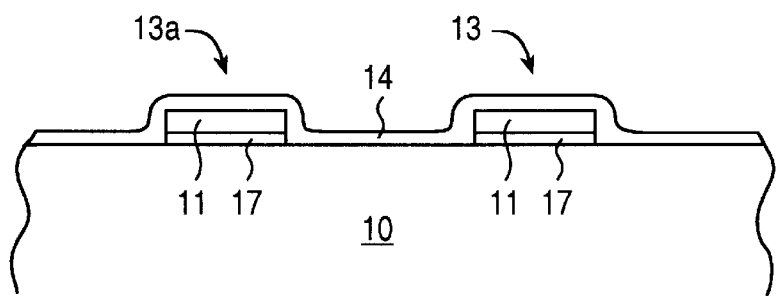
FIG. 8 is a cross-sectional diagram showing the deposition of a dielectric layer over the pretreated structure of FIG. 7.

Next, the wafer is returned to the processing chamber and the sacrificial layer 12 is etched away, as shown in FIG. 7. $NF_3$ plasma can be utilized for this process. After exposing the underlying M1 layer 11, the M1 layer 11 is pretreated to make the surface more reactive for the dielectric deposition. The pretreatment results in having more termination sites 18 to be present on the M1 material to react with a species of a precursor used to deposit the overlying dielectric layer. As shown in FIG. 8, the dielectric layer 14 is deposited above the substrate 10 and the M1 layer 11. Again, it is to be noted that the dielectric layer 14 is deposited without subjecting the exposed M1 layer to oxidation and/or contamination.

A variety of activation processes are available for pretreating the M1 layer. For depositing $Al_2O_3$ on TaN, $NH_3/H_2/N_2$ plasma is used to terminate the surface with $NH_x$ species. This plasma also eliminates the surface fluorine on the substrate surface. Then, the dielectric layer 14 ($Al_2O_3$ in this instance) is deposited, in which the $NH_x$ species are reacted with trimethyle aluminum (TMA) to initiate $Al_2O_3$ ALD. $Al_2O_3$ is deposited to an approximate thickness of 15–50 Angstroms.

Figure 9:
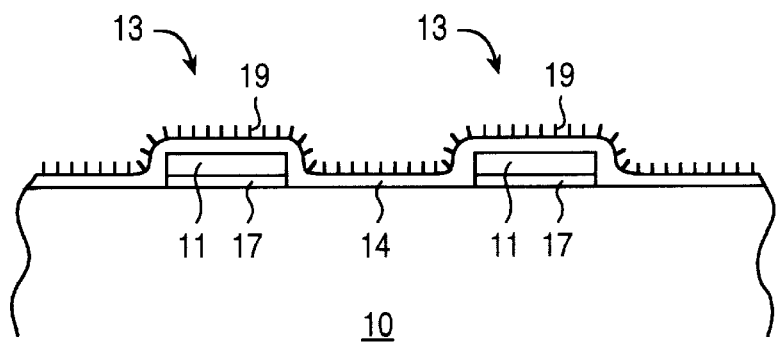
FIG. 9 is a cross-sectional diagram showing a subsequent pretreatment of the dielectric layer of FIG. 8 to make the surface of the dielectric layer reactive.
Figure 10:
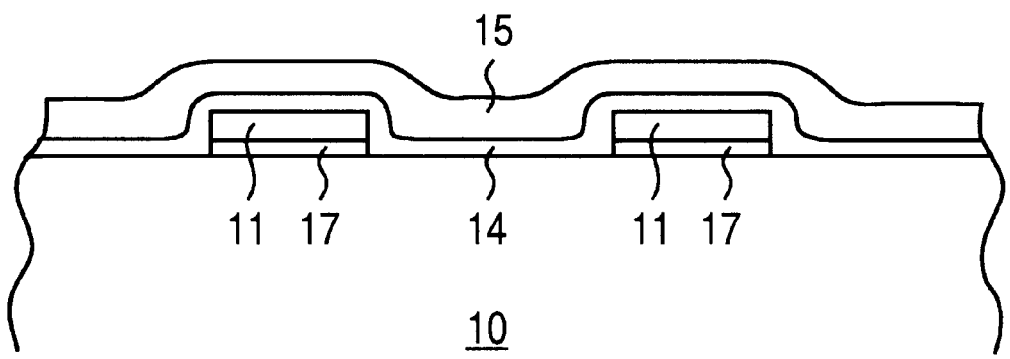
FIG. 10 is a is a cross-sectional diagram showing the deposition of a top conductive layer over the dielectric layer of FIG. 9.
Figure 11:
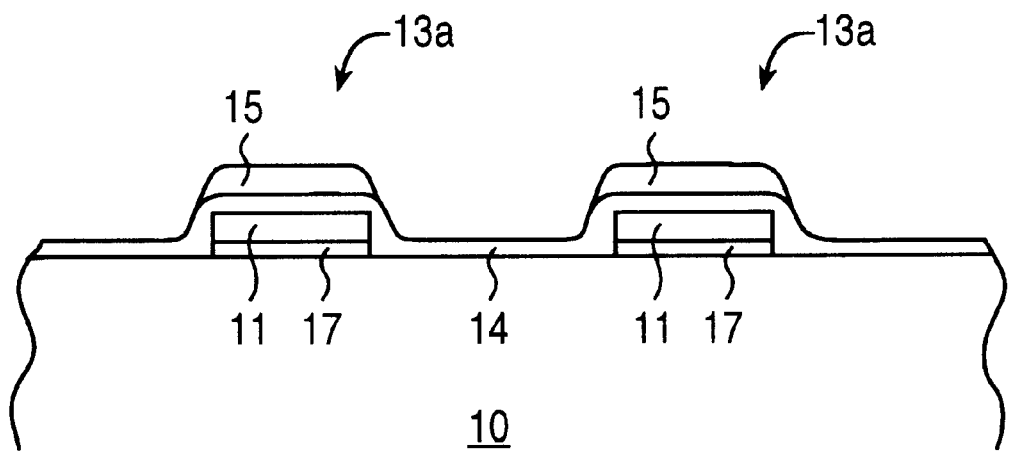
FIG. 11 is a cross-sectional diagram showing the final formation of the MIM capacitor stack from the structure of FIG. 10.

Subsequently, as shown in FIG. 9, the dielectric layer 14 is pretreated to make the surface more reactive to the subsequent M2 deposition. The top surface of the dielectric layer 14 is activated using the $NH_3/H_2/N_2$ plasma, as shown by having ample terminations 19. Then, the M2 layer 15 is deposited on the activated surface of layer 14. The resulting structure is shown in FIG. 10. A typical material for use for the composition of the M2 layer is W or $W_xN$. In this instance the W or $W_xN$ is deposited by ALD on the $NH_3/H_2/N_2$ plasma activated surface of $Al_2O_3$ to a thickness of approximately 30–3,000 Angstroms. Again it is to be noted that the M2 layer 15 can be deposited by other processes, including CVD and PECVD, or a combination of ALD seed layer and CVD, PECVD or electroplating. FIG. 11 illustrates the final stacked MIM capacitor 13a after etching.

It is appreciated that the pretreatment of the various surfaces can be achieved to deposit enough radical species to exchange with the surface. In this instance, these radical species provide termination sites for bonding to a specie of the precursor. However, in some instances, it may be desirable to actually deposit an intermediate layer above the surface. In this instance, an actual intermediate layer is formed above the surface and in which the termination sites are actually present on top of this intermediate layer.

An intermediate layer may be required in some instances when the substrate cannot be made reactive with either of the ALD molecular precursors by a simple attachment or exchange of surface species. The ultra thin intermediate layer is deposited as part of the pretreatment process. The intermediate layer provides a new surface that is reactive to one or both precursors. The layer is formed having a thickness which is kept minimal, but sufficient for activation. The intermediate layer may be conductive, semiconductive or insulating (dielectric). Typically, it will match the electrical properties of either the substrate or the overlying film being grown. For example, an intermediate layer is needed as a transition layer when W or $WN_x$ films are deposited on $SiO_2$. In this instance, $Al_2O_3$ (which is an insulator) or TiN, Ti, Ta or $Ta_xN$ (which are conductors) can be used for the intermediate layer. In the second embodiment described above, the adhesion layer 17 also performs as an intermediate layer as well. It is to be noted further, that the intermediate layer is typically deposited by ALD for the pretreatment of the surface.

It is also appreciated that other techniques can be used as well. For example, a leaching process can be utilized. Since some surfaces are quite inert, a process other than reactive exchange or attachment may be desirable. For example, hydrocarbon and fluorocarbon polymers are utilized for low-k dielectrics. Adhesion of films, for sealing (insulating) or for forming a barrier (metals, metal nitrides), is difficult to achieve. In these instances, leaching hydrogen or fluorine from the top layer of the polymer can activate the surface for ALD.

A number of examples of ALD and pretreatment of surface are provided below with relevant equations. It is to be understood that the examples listed below are provided as examples and in no way limit the invention to just these examples.

EXAMPLE 1

ALD deposition of $Al_2O_3$ on silicon. A silicon substrate is first activated (pretreated) by forming thin layers of silicon oxide ($SiO_2$) or silicon oxinitride, in which OH and/or $NH_x$ groups form the terminations. The process involves $O_2/H_2/H_2O/NH_3$ remote plasma that includes different ratios of the constituents to form the terminations prior to the introduction of the first precursor to grow the $Al_2O_3$ thin film layer on silicon.

Si—H+OH.+H.+$NH_x$.→Si—OH+Si—$NH_x$(where "." defines a radical)

Si—OH+Al($CH_3$)$_3$→Si—O—Al($CH_3$)$_2$+$CH_4$

Si—$NH_x$+Al($CH_3$)$_3$→Si—$NH_{x-1}$—Al($CH_3$)$_2$+$CH_4$

EXAMPLE 2

ALD deposition of $Al_2O_3$ on silicon. The silicon substrate is activated by forming thin layers of $SiO_2$ that is hydroxilated by exposing HF cleaned (H terminated) silicon to a pulse of $H_2O$ at temperatures below 430° C. This process results in a self-saturated layer of $SiO_2$ that is approximately 5 angstroms thick.

Si—H+$H_2O$→Si—O—Si—OH+$H_2$

Si—OH+Al($CH_3$)$_3$→Si—O—Al($CH_3$)$_2$+$CH_4$

EXAMPLE 3

ALD deposition of $Al_2O_3$ on $WN_x$. $NH_3/H_2/N_2$ plasma is used to leach fluorine from the top layers of the $WN_x$ film and terminate the surface with $NH_x$ species. These species are reacted with trimethyl aluminum (TMA) to initiate deposition of $Al_2O_3$ on $WN_x$.

$W_xN$+H.+$NH_x$.→W—$NH_x$

W—$NH_x$+Al($CH_3$)$_3$→W—$NH_{x-1}$—Al($CH_3$)$_2$+$CH_4$

EXAMPLE 4

ALD deposition of $Al_2O_3$ on TIN. $NH_3/H_2/N_2$ plasma is used to terminate the surface with $NH_x$ species. These species are reacted with TMA to initiate $Al_2O_3$ ALD.

TiN+H.+$NH_x$.→Ti—$NH_x$

Ti$NH_x$+Al($CH_3$)$_3$→Ti$NH_{x-1}$—Al($CH_3$)$_2$+$CH_4$

EXAMPLE 5

ALD deposition of $Al_2O_3$ on Ti. $NH_3/H_2/N_2$ plasma is used to nitridize the surface and terminate the surface with $NH_x$ species. Maintain conditions to avoid extensive nitridization into the Ti film. The $NH_x$ species are reacted with TMA to initiate $Al_2O_3$ ALD.

Ti+$NH_x$.+H.→Ti$NH_x$

Ti$NH_x$+Al($CH_3$)$_3$→Ti$NH_{x-1}$—Al($CH_3$)$_2$+$CH_4$

EXAMPLE 6

ALD deposition of $Al_2O_3$ on W. $NH_3/H_2/N_2$ plasma is used to nitridize the surface and terminate the surface with $NH_x$ species. Maintain conditions to avoid extensive nitridization into the W film. The $NH_x$ species are reacted with TMA to initiate $Al_2O_3$ ALD.

W+$NH_x$.+H.→W$NH_x$

W—$NH_x$+Al($CH_3$)$_3$→W—$NH_{x-1}$—Al($CH_3$)$_2$+$CH_4$

EXAMPLE 7

ALD deposition of $Al_2O_3$ on Ta. $NH_3/H_2/N_2$ plasma is used to nitridize the surface and terminate the surface with $NH_x$ species. Maintain conditions to avoid extensive nitridization into the Ta film. The $NH_x$ species are reacted with TMA to initiate $Al_2O_3$ ALD.

Ta+$NH_x$.+H.→Ta$NH_x$

Ta$NH_x$+Al($CH_3$)$_3$→Ta$NH_{x-1}$—Al($CH_3$)$_2$+$CH_4$

EXAMPLE 8

ALD deposition of $Al_2O_3$ on $Ta_xN$. $NH_3/H_2/N_2$ plasma is used to terminate the surface with $NH_x$ species. The $NH_x$ species are reacted with TMA to initiate $Al_2O_3$ ALD.

$Ta_xN$+$NH_x$.+H.→Ta$NH_x$

Ta$NH_x$+Al($CH_3$)$_3$→Ta$NH_{x-1}$—Al($CH_3$)$_2$+$CH_4$

EXAMPLE 9

ALD deposition of $Ta_2O_5$ on $Al_2O_3$. The process involves $O_2/H_2/H_2O$ remote plasma that includes different ratios of the constituents. This plasma is used to terminate the surface with OH species that are reactive with TaCl$_5$.

$$Al_2O_3 + OH. + O. + H. \rightarrow Al_2O_3-OH$$

$$Al_2O_3-OH + TaCl_5 \rightarrow Al_2O_3-O-TaCl_4 + HCl$$

EXAMPLE 10

ALD deposition of Al$_2$O$_3$ on Ta$_2$O$_5$. The process involves O$_2$/H$_2$/H$_2$O remote plasma that includes different ratios of the constituents. This plasma is used to terminate the surface with OH species that are reactive with TaCl$_5$.

$$Ta_2O_5 + O. + H. + OH. \rightarrow Ta_2O_5-OH$$

$$Ta_2O_5 + OH + Al(CH_3)_3 \rightarrow Ta_2O_5-O-Al(CH_3)_2 + CH_4$$

EXAMPLE 11

ALD deposition of TiO$_x$ on Al$_2$O$_3$. The process involves O$_2$/H$_2$/H$_2$O remote plasma that includes different ratios of the constituents. This plasma is used to terminate the surface with OH species that are reactive with TMA.

$$Al_2O_3 + O. + H. + OH. \rightarrow Al_2O_3-OH$$

$$Al_2O_3-OH + TiCl_4 \rightarrow Al_2O_3-O-TiCl_3 + HCl$$

EXAMPLE 12

ALD deposition of Al$_2$O$_3$ on TiO$_x$. The process involves O$_2$/H$_2$/H$_2$O remote plasma that includes different ratios of the constituents. This plasma is used to terminate the surface with OH species that are reactive with TiCl$_4$.

$$TiO_2 + O. + H. + OH. \rightarrow TiO_2-OH$$

$$TiO_2-OH + Al(CH_3)_3 \rightarrow TiO_2-O-Al(CH_3)_2 + CH_4$$

EXAMPLE 13

ALD deposition of TiO$_x$ on TiN. NH$_3$/H$_2$/N$_2$ plasma is used to terminate the surface with NH$_x$ species. The NH$_x$ species are reacted with TiCl$_4$ to initiate TiO$_x$ ALD.

$$TiN + H. + NH_x. \rightarrow Ti-NH_x$$

$$Ti-NH_x + TiCl_4 \rightarrow TiNH_{x-1}-TiCL_3 + HCl$$

EXAMPLE 14

ALD deposition of W on TiN. NH$_3$/H$_2$/N$_2$ plasma is used to terminate the surface with NH$_x$ species. The NH$_x$ species are reacted with TiCl$_4$ to initiate TiN ALD.

$$TiN + H. + NH_x. \rightarrow Ti-NH_x$$

$$Ti-NH_x + WF_6 \rightarrow TiNH_{x-1}-WF_5 + HF$$

EXAMPLE 15

ALD deposition of WN$_x$ on TiN. NH$_3$/H$_2$/N$_2$ plasma is used to terminate the surface with NH$_x$ species. The NH$_x$ species are reacted with TiCl$_4$ to initiate WN$_x$ ALD.

$$TiN + H. + NH_x. \rightarrow Ti-NH_x$$

$$Ti-NH_x + WF_6 \rightarrow TiNH_{x-1}-WF_5 + HF$$

EXAMPLE 16

ALD deposition of WN$_x$ on SiO$_2$. O$_2$/H$_2$/H$_2$O remote plasma that includes different ratios of the constituents is used to terminate the surface with OH species that are reactive with TiCl$_4$. The TiCl$_4$ species is used to grow an intermediate layer of Ti or TiN. The final layer is terminated with NH$_x$ species (from the TiN ALD) which reacts with WF$_6$ to initiate the WN$_x$ ALD process.

$$SiO_2 + H. + O. + OH. \rightarrow Si-OH$$

$$Si-OH + TiCl_4 \rightarrow SiO-TiCl_3 + HCl$$

$$SiO-TiCl_3 + NH_3 \rightarrow SiO-TiN-NH_x + HCl$$

$$SiO-TiN-NH_x + WF_6 \rightarrow SiO-TiN-NH_{x-1}WF_5 + HF$$

EXAMPLE 17

ALD deposition of W on SiO$_2$. O$_2$/H$_2$/H$_2$O remote plasma that includes different ratios of the constituents is used to terminate the surface with OH species that are reactive with TiCl$_4$. The TiCl$_4$ species is used to grow an intermediate layer of Ti or TiN. The final layer is terminated with NH$_x$ species (from the TiN ALD) which reacts with WF$_6$ to initiate the W ALD process.

$$SiO_2 + H. + O. + OH. \rightarrow Si-OH$$

$$Si-OH + TiCl_4 \rightarrow SiO-TiCl_3 + HCl$$

$$SiO-TiCl_3 + NH_3 \rightarrow SiO-TiN-NH_x + HCl$$

$$SiO-TiN-NH_x + WF_6 \rightarrow SiO-TiN-NH_{x-1}WF_5 + HF$$

Alternatively, TaCl$_5$ can be used for growing an intermediate Ta$_x$N layer.

EXAMPLE 18

ALD deposition of WN$_x$ on hydrocarbon polymer (low-k dielectric layer). NF$_3$ remote plasma generates fluorine atoms that leach out hydrogen from the hydrocarbon. The leached surface is reacted with TiCl$_4$ and followed by TiN or Ti/TiN ALD of a thin intermediate layer. The NH$_x$ terminated surface that is prepared during the TiN ALD is reacted with WF$_6$ to initiate WN$_x$ ALD.

$$C_nH_m + F. \rightarrow C_pH_qC.$$

$$C_pH_qC. + TiCl_4 \rightarrow C_pH_{q-1}CTiCl_3 + HCl$$

$$C_pH_{q-1}CTiCl_3 + NH_3 \rightarrow C_pH_{q-1}CTiN-NH_x + HCl$$

$$C_pH_{q-1}CTiN-NH_x + WF_6 \rightarrow C_pH_{q-1}CTiN-N_{x-1}-WF_5 + HF$$

EXAMPLE 19

ALD deposition of WN$_x$ on perfluorocarbon polymer (low-k dielectric layer). H$_2$/NH$_3$ remote plasma generates H atoms and NH$_x$ radicals that leach out fluorine from the hydrocarbon. The leached surface is reacted with TiCl$_4$ and followed by TiN or Ti/TiN ALD of a thin intermediate layer. The NH$_x$ terminated surface that is prepared during the TiN ALD is reacted with WF$_6$ to initiate WN$_x$ ALD.

$$C_mF_n + H. + NH_x. \rightarrow C_pF_qC. + HF$$

$$C_pF_qC. + TiCl_4 \rightarrow C_pF_qC-TiN-NH_x$$

$$C_pF_qC-TiN-NH_x + WF_6 \rightarrow C_pF_qC-TiNH_{x-1}-NWF_5 + HF$$

EXAMPLE 20

ALD deposition of oxide on another oxide. The surface of the first oxide is activated by O$_2$/H$_2$/H$_2$O remote plasma that includes different ratios of the constituents. This process is used to terminate the surface with OH species that are reactive with a metal precursor for the next oxide layer.

$$MIO_x + O. + H. + OH. \rightarrow MIO_x{-}OH$$

$$MIO_x{-}OH + M2L_y \rightarrow MIO_x{-}O{-}M2L_{y-1} + HL$$

EXAMPLE 21

ALD deposition of oxide on metal, semiconductor or metal nitride. $NH_3/H_2/N_2$ plasma is used to terminate the surface with $NH_x$ species that are reactive with a metal precursor for initiating ALD.

$$M1 + H. + NH_x. \rightarrow M1{-}NH_x$$

$$M1NH_x + M2L_y \rightarrow M1NH_{x-1}M2L_{y-1} + HL$$

EXAMPLE 22

ALD deposition of metal, semiconductor or conductive metalnitride on oxide. $NH_3/H_2/N_2$ plasma is used to terminate the surface with $NH_x$ species or $O_2/H_2/H_2O$ plasma generated radicals are used to terminate the surface with OH species. The species are reactive with a metal precursor for initiating ALD.

$$MIO_x + O. + H. + OH. \rightarrow MIO_x{-}OH$$

$$MIO_x{-}OH + M2L_y \rightarrow MIO_x{-}O{-}M2L_{y-1} + HL$$

Again, it is appreciated that the above are described as examples only and that many other ALD reactions and pretreatment procedures are available.

Figure 12A:
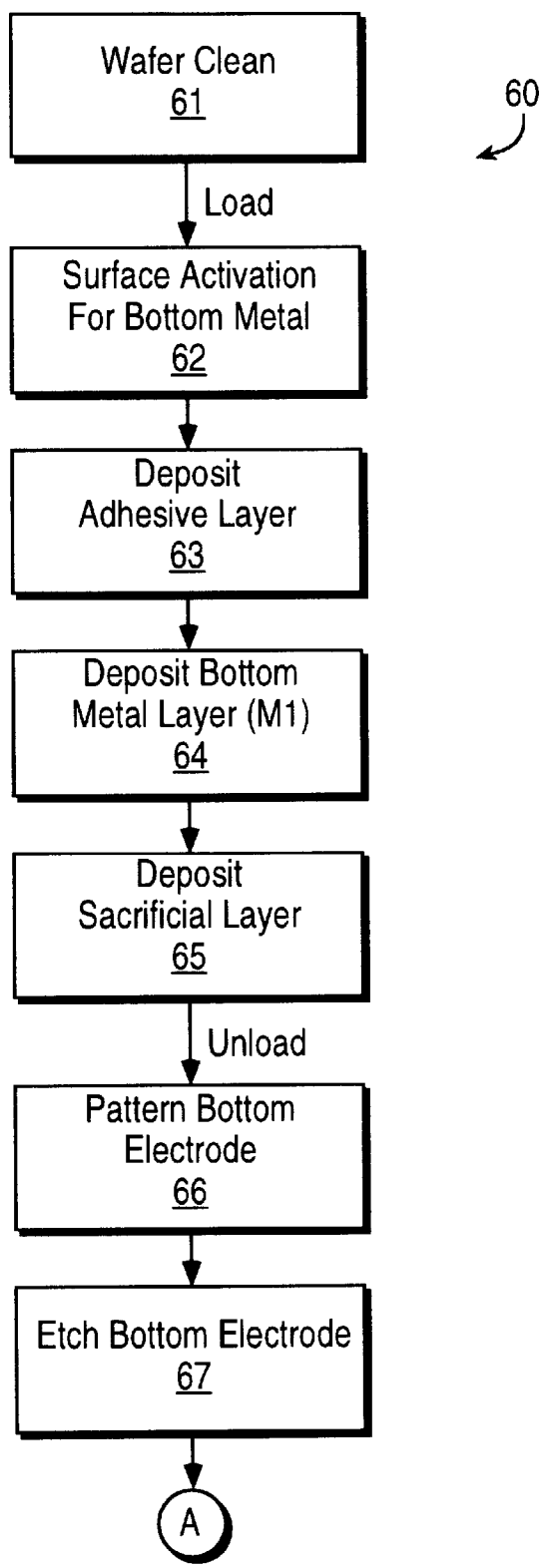
FIGS. 12A–B illustrate a flow diagram for practicing one embodiment of the present invention.
Figure 12B:
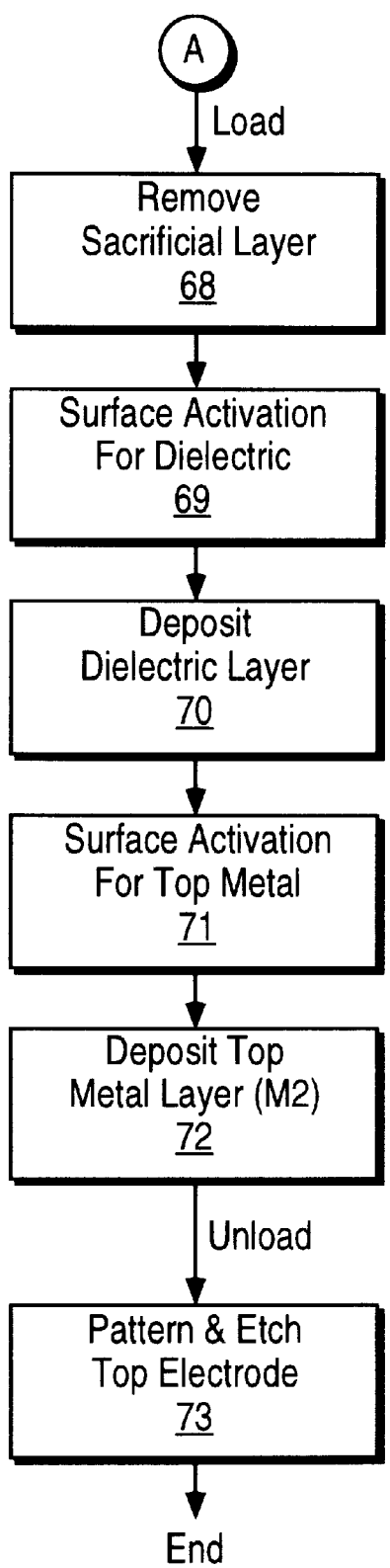

Referring to FIG. 12 (A–B), a process flow for fabricating the MIM capacitor is illustrated. Further, the process flow of the present invention can be practiced using the reactor 30 shown in FIG. 13 and/or the cluster tool 50 shown in FIG. 14. The cluster tool 50 of FIG. 14 is shown having two load/unload (interface) chambers 52 for the loading and unloading the wafer 51. Each chamber 52 can load and unload a wafer, but usual practice is to have one interface for loading and the second for unloading wafers from the tool 50. Also, although one wafer 51 is shown, cluster tool 50 can be designed to accommodate one wafer or a plurality of wafers (including a cassette of wafers).

The cluster tool 50 has a number of individual cluster chambers 53. Four are shown in the example, but the actual number will depend on the design and application. Generally, the interior region 54 of the tool is designed for facilitating wafer transfer between the chambers 53 clustered about, as well as to the load/unload chambers 52. Typically, a handler 55 (such as a robotic arm) is used to move the wafer from place to place. Also, the interior area of the tool is segregated from the external environment. An inert gas or vacuum environment is typically present. It is appreciated that the operation of a generic cluster tool is known in the art.

In the particular examples described above for the practice of the present invention, one chamber 56 is used for M1 layer deposition; second chamber 57 for the deposition of the sacrificial layer, as well as for its removal; third chamber 58 for the dielectric deposition; and fourth chamber 59 for the M2 deposition. In reference to the flow diagram 60 of FIG. 12, the wafer (or wafers) is cleaned (block 61) and loaded into the first chamber 56 of the cluster tool 50. Surface activation (block 62) of the substrate 10, deposition of the adhesion layer 17 (block 63) and the deposition of the M1 layer 11 (block 64) are performed within chamber 56.

Then, the wafer is transferred to the second chamber 57 for the deposition of the sacrificial layer 12 (block 65) without removing the wafer from the cluster environment 54. The wafer is unloaded and removed to another tool for the pattern delineation to pattern the bottom electrode (block 66) and then etched to form the bottom portion of the capacitor stack (block 67). Then the wafer is reloaded into the cluster tool 60 and inserted back into the chamber 57, where the sacrificial layer 12 is removed by a plasma etch (block 68).

Subsequently, the wafer is transferred to the third chamber 58, where it is surface activated for dielectric deposition (block 69). Then the dielectric layer is deposited (block 70). Next the wafer is transferred to the fourth chamber 59 where it is surface activated (block 71) and M2 layer deposited (block 72). After being unloaded from the cluster tool 50, the wafer is again subjected to a patterning and etching to remove the excess M2 material, so that the M2 material resides only atop the capacitor stack (block 67). The final stack of M1 dielectric-M2 results in a MIM capacitor stack.

Again it is to be noted that the sacrificial layer 12 is deposited atop the M1 layer 11, without subjecting the M1 material to oxidation or contamination. Likewise, the dielectric material is deposited above the M1 (after removal of the sacrificial layer) without subjecting M1 to ambient contamination and oxidation. Further, M2 is deposited over the dielectric without subjecting the dielectric layer to ambient contamination, since the wafer remains within the cluster tool between dielectric deposition and M2 deposition. Accordingly, more pure electrode-dielectric interface(s) can be achieved for the fabrication of the MIM capacitor.

Furthermore, it is appreciated that some, all or none of the pretreatment processes may be used to fabricate the MIM, in that not every layer may need pretreatment to make the surface active for the ALD precursor.

Figure 13:
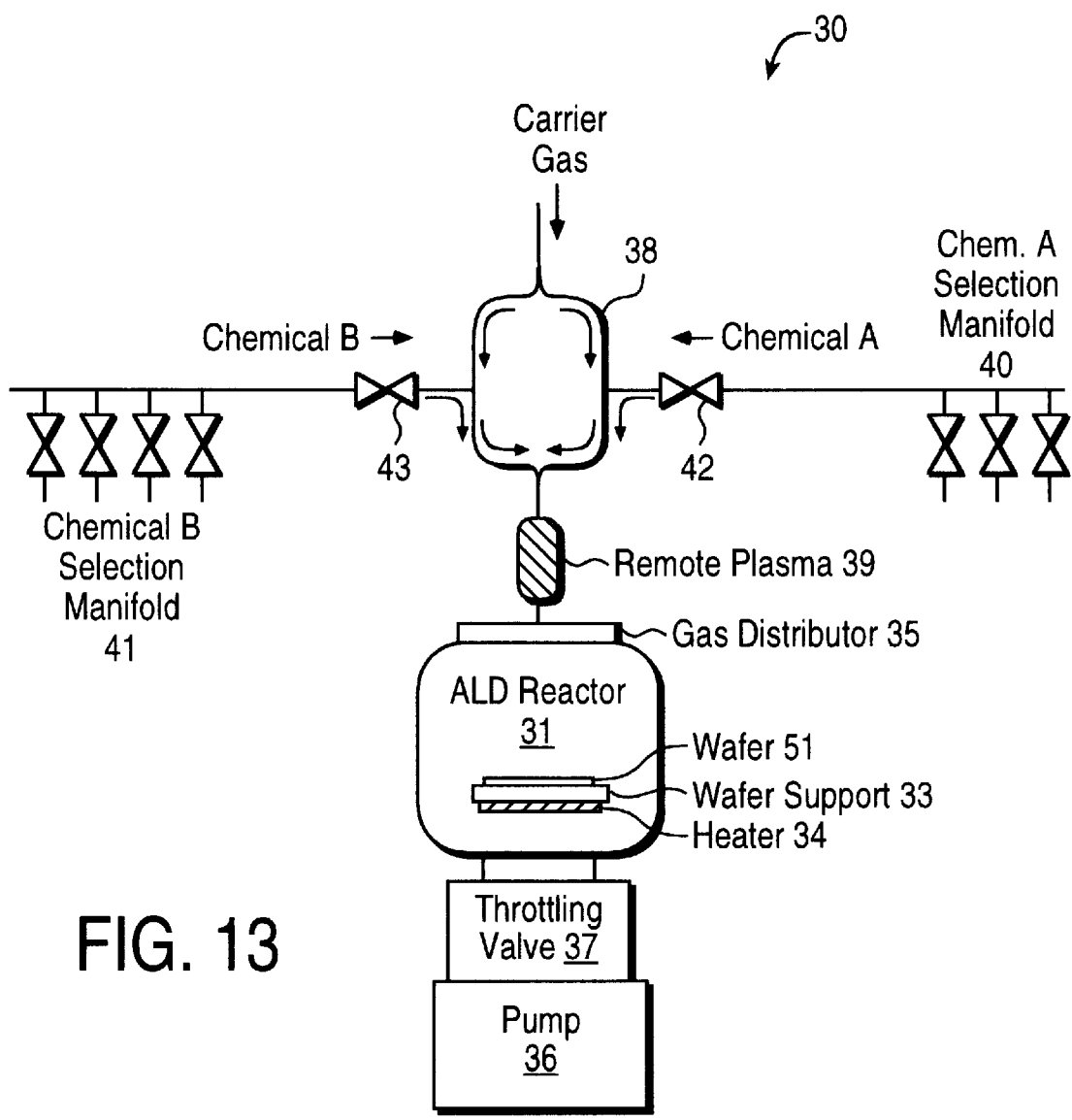
FIG. 13 is a block diagram showing one reactor apparatus for performing ALD, as well as pretreating the surface of a layer prior to ALD, in order to fabricate an MIM capacitor practicing the present invention.
Figure 14:
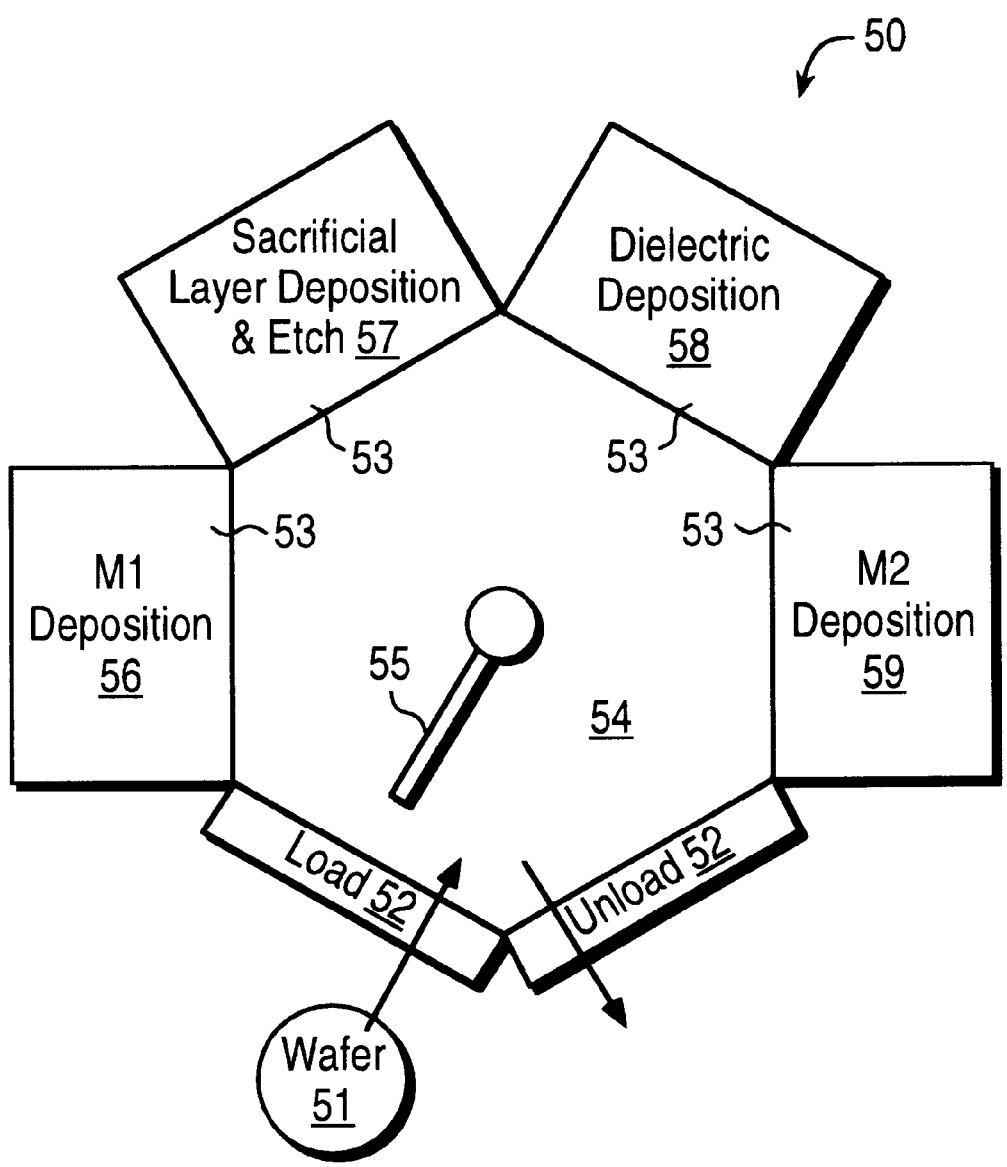
FIG. 14 is a block diagram showing a cluster tool for practicing the present invention.

An apparatus for performing ALD to practice the present invention is shown in FIG. 13. An example ALD reactor apparatus 30 is shown. It is appreciated reactor 30 is included within each cluster chamber 53. Also, a variety of other devices and equipment can be utilized instead of reactor 30. Reactor 30 includes a processing chamber 31 for housing the wafer 51. Typically, the wafer 51 resides atop a support (or chuck) 33. A heater 34 is also coupled to the chuck 33 to heat the chuck 33 and the wafer 51 for plasma deposition. The processing gases are introduced into the chamber 31 through a gas distributor 35 located at one end of the chamber 31. A vacuum pump 36 and a throttling valve 37 are located at the opposite end to draw and regulate the gas flow across the wafer surface.

A mixing manifold 38 is used to mix the various processing gases and the mixed gases are directed to a plasma forming zone 39 for forming the plasma. A variety of CVD techniques for combining gases and forming plasma can be utilized, including adapting techniques known in the art. The remotely formed plasma is then fed into gas distributor 35 and then into the chamber 31.

The mixing manifold 38 has two inlets for the introduction of chemicals. A carrier gas is introduced into the mixing manifold 38. The carrier gas is typically an inert gas, such as nitrogen. The mixing manifold 38 also has two inlets for other chemistries as well. In the example diagram of FIG. 13, chemical A and chemical B are shown combined with the carrier gas. Chemistry A pertains to the first precursor and chemistry B pertains to the second precursor for performing ALD for the two precursor process described above. Chemical selection manifold 40 and 41, comprised of a number of regulated valves, provide for the selection of chemicals that can be used as precursors A and B, respectively. Inlet valves 42 and 43 respectively regulate the introduction of the precursor chemistries A and B into the mixing manifold.

The operation of the reactor for performing ALD is as follows. Once the wafer is resident within the processing chamber 31, the chamber environment is brought up to meet desired parameters. For example, raising the temperature of the wafer in order to perform ALD. The flow of carrier gas is turned on so that there is a constant regulated flow of the carrier gas as the gas is drawn by the vacuum created by the pump 36. When ALD is to be performed, valve 42 is opened to allow the first precursor to be introduced into the carrier gas flow. After a preselected time, valve 42 is closed and the carrier gas purges any remaining reactive species. Then, valve 43 is opened to introduce the second precursor into the carrier gas flow. Again after another preselected time, the valve 43 is closed and the carrier gas purges the reactive species form the chambers of the reactor. The two chemicals A and B are alternately introduced into the carrier flow stream to perform the ALD cycle to deposit a film layer.

When the pretreatment of the surface is to be performed by plasma, the pretreating species can be introduced into the mixing manifold 38 to mix with the carrier gas. Again, the pretreatment is performed prior to the initial introduction of the first ALD precursor used to deposit the film. Appropriate valves 40, 41, 42, 43 can be activated to introduce the pretreatment chemistry into the carrier gas stream. Accordingly, the introduction of the pretreatment chemistry can be achieved from adapting designs of a standard ALD reactor.

Thus, an apparatus and method to perform fully integrated ALD to fabricate MIM capacitors is described. The present invention provides integration solution throughout the necessary steps of bottom electrode patterning and eliminate electrode-dielectric interface contamination. The integrated process can be applied to deposit MIM structures on a variety of substrates, including BPSG, W and $Wsi_x$. The bottom electrode can be realized by a variety of metals, metal nitrides or stack of metals and/or metal nitrides. For example, Ti, Ta, TaN, TiN, W/Ti, $W_xN$/Ti, W/TiN, $W_xN$/TiN, W/Ta, $W_xN$/Ta, $W_xN$/TaN, W/Al and $W_xN$/Al can be used. The dielectric selection is comprised of a variety of high K dielectrics or stacks of high K dielectrics, including $Al_2O_3$, $Ta_2O_5$, $TiO_2$, $Nb_2O_5$, $HfO_2$ and $ZrO_2$.

The sacrificial layer can be selected for etching by remote plasma generated fluorine. For example, $SiO_2$, W, $W_xN$, Si, SiC and $WSi_x$ can be used for the sacrificial layer. The top electrode material selection is not limited by the requirement for a top layer that does not etch with fluorine. Since uniformity and conformity play less critical role for the top metal layer, other processes than ALD can be used. Accordingly, a variety of other processes may be used for the top metal layer.

It is further to be noted that the present invention can be applied to various capacitor structures, including stacked capacitors, trench capacitors and capacitors formed at low temperatures embedded amongst interconnects. Also, although the embodiments described is in reference to MIM capacitors, the invention can be readily adapted to other materials as well. For example, the invention can be adapted for use in fabricating MIS and SIS structures as well.

We claim:

1. A method of fabricating a metal-insulator-metal capacitor comprising:

depositing a bottom conductive layer by atomic layer deposition;

depositing a sacrificial layer, which is not a photoresist, above the bottom conductive layer by atomic layer deposition without exposing the bottom conductive layer to an ambient environment;

exposing the sacrificial layer to an oxidizing ambient to undergo a photolithographic and etching processes that form a defined stacked structure by pattern delineating the bottom conductive and sacrificial layers;

removing the sacrificial layer to expose the underlying bottom conductive layer without exposing the bottom conductive layer to the ambient environment;

depositing a dielectric layer over the exposed bottom conductive layer by atomic layer deposition without exposing the bottom conductive layer to the ambient environment;

depositing a top conductive layer over the dielectric layer without exposing the underlying dielectric layer to the ambient environment; and forming the top conductive layer over the defined stacked structure.

2. The method of claim 1 wherein the depositing of the top conductive layer includes depositing the top conductive layer by atomic layer deposition.

3. The method of claim 1 wherein the depositing of the top conductive layer includes depositing the top conductive layer by chemical vapor deposition.

4. The method of claim 1 wherein the depositing of the top conductive layers includes depositing the top conductive layer by plasma-enhanced chemical vapor deposition.

5. A method of fabricating a metal-insulator-metal capacitor comprising:

depositing a bottom metal layer by atomic layer deposition;

depositing a sacrificial layer comprised of metal above the bottom metal layer by atomic layer deposition without exposing the bottom metal layer to an ambient environment;

exposing the sacrificial layer to an oxidizing ambient to undergo a photolithographic and etching processes that form a defined stacked structure by pattern delineating the bottom metal and sacrificial layers;

removing the sacrificial layer to expose the underlying bottom metal layer by selective etch without exposing the bottom metal layer to the ambient environment and without etching the underlying bottom metal layer;

depositing a dielectric layer over the exposed bottom metal layer by atomic layer deposition without exposing the bottom metal layer to the ambient environment;

depositing a top metal layer over the dielectric layer without exposing the underlying dielectric layer to the ambient environment; and forming the top metal layer over the defined stacked structure.

6. The method of claim 5 further comprising pretreating a surface underlying the bottom metal layer to make the surface reactive to atomic layer deposition of the bottom metal layer.

7. The method of claim 5 further comprising depositing an adhesion layer prior to depositing the bottom metal layer, the adhesion layer being deposited by atomic layer deposition.

8. The method of claim 5 further comprising pretreating the bottom metal layer after removal of the sacrificial layer to make the bottom metal layer reactive to atomic layer deposition of the dielectric layer.

9. The method of claim 5 further comprising pretreating the dielectric layer to make the dielectric layer reactive to the depositing of the top metal layer.

10. The method of claim 5 further comprising pretreating a substrate surface to make the substrate surface reactive to atomic layer deposition of an adhesion layer and depositing the adhesion layer prior to depositing the bottom metal layer, the adhesion layer being deposited by atomic layer deposition.

11. The method of claim 10 further comprising pretreating the bottom metal layer after removal of the sacrificial layer to make the bottom metal layer reactive to atomic layer deposition of the dielectric layer.

12. The method of claim 11 further comprising pretreating the dielectric layer to make the dielectric layer reactive to the depositing of the top metal layer.

* * * * *